United States Patent

Sharma et al.

(10) Patent No.: US 8,131,515 B2
(45) Date of Patent: Mar. 6, 2012

(54) DATA CENTER SYNTHESIS

(75) Inventors: Ratnesh Sharma, Fremont, CA (US); Chandrakani Patel, Fremont, CA (US); Gopalakrishnan Janakiraman, Bellevue, WA (US); Cullen Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 611 days.

(21) Appl. No.: 12/254,664

(22) Filed: Oct. 20, 2008

(65) Prior Publication Data
US 2009/0132699 A1 May 21, 2009

Related U.S. Application Data

(60) Provisional application No. 60/989,335, filed on Nov. 20, 2007.

(51) Int. Cl.
*G06F 17/50* (2006.01)

(52) U.S. Cl. .......................................................... 703/1
(58) Field of Classification Search ...................... 703/1
See application file for complete search history.

(56) References Cited

U.S. PATENT DOCUMENTS

2006/0015589 A1 * 1/2006 Ang et al. ..................... 709/220

OTHER PUBLICATIONS

Cinato, P.; Bianco, C.; Licciardi, L.; Pizzuti, F.; Antonetti, M.; Grossoni, M.; , "An innovative approach to the environmental system design for TLC rooms in Telecom Italia," Telecommunications Energy Conference, 1998. INTELEC. Twentieth International , vol., no., pp. 770-776, 1998.*

* cited by examiner

*Primary Examiner* — David Silver

(57) ABSTRACT

A data center is designed by determining a compute description that describes computer resources to be used in the system from design requirements and models of the computer resources. A facility description that describes facilities to be used in the data center is determined from the compute description and models of the facilities. An integrated system describing the design of the data center is determined from the facility and compute descriptions.

19 Claims, 6 Drawing Sheets

$$\text{Cost}_{total} = \underbrace{(1+K_1+L_1+K_2L)U_{\$,grid}P_{consumed}^{hardware}}_{\text{Burdened Power Consumption}} + \underbrace{R(M_{total}S_{avg}+IT_{dep}+\sigma_1)}_{\substack{\text{Hardware, Software} \\ \text{Personnel per rack}}} + \underbrace{\left(\frac{\$}{ft^2}\right)(A_{critical}, ft^2)}_{\text{Real Estate}}$$

DATA CENTER SYNTHESIS

CROSS-REFERENCE TO RELATED APPLICATION

The present application claims priority from the provisional application Ser. No. 60/989,335, filed Nov. 20, 2007, the contents of which are incorporated herein by reference in their entirety.

BACKGROUND

Managing data center maintenance and management costs is lucrative for businesses owning or operating data centers. The total cost of ownership (TCO) of an industry standard rack comprised of 42 1 U servers and aggregating to 13 KW is approximately $15,000 per month in a given data center. This TCO is astronomical, especially for information technology (IT) services in emerging markets. In order to achieve a significant reduction of the TCO, the cost components that drive physical design and data center management costs must be reduced. These cost components include costs associated with space, power, cooling, IT hardware, amortization and maintenance of facility power and cooling equipment, and operations processes for coordinating IT and facilities. Currently, an integrated design and management solution that addresses these cost components is not available to achieve a given TCO. Furthermore, motivated by sustainability and the economics of electricity generation, especially for emerging markets, the data center should be designed for efficient power consumption and for maintaining a balance of power with distributed power sources.

Current data center creation tools that deal with physical designs and configurations are fragmented. These conventional tools lack a unified synthesis and management system to enable a customer to integrate compute and facility hardware and software to meet TCO goals by minimizing component cost, assessing and ensuring reliability at a given uptime. The amount of active redundancy such as extra power and cooling components applied to the data center is based on rules of thumb applied, in excess, over the entire data center.

BRIEF DESCRIPTION OF DRAWINGS

The embodiments of the invention will be described in detail in the following description with reference to the following figures.

FIG. 4 illustrates an equation for calculating a TCO, according to an embodiment;

DETAILED DESCRIPTION OF EMBODIMENTS

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

According to an embodiment, a data center synthesis system provides a design tool for creating a complete integrated system comprised of both computer resources and facilities. The data center synthesis system is operable to compile IT and facility designs that meet customer and administrator targets, such as cost targets, SLA targets, and power efficiency.

Figure 1:
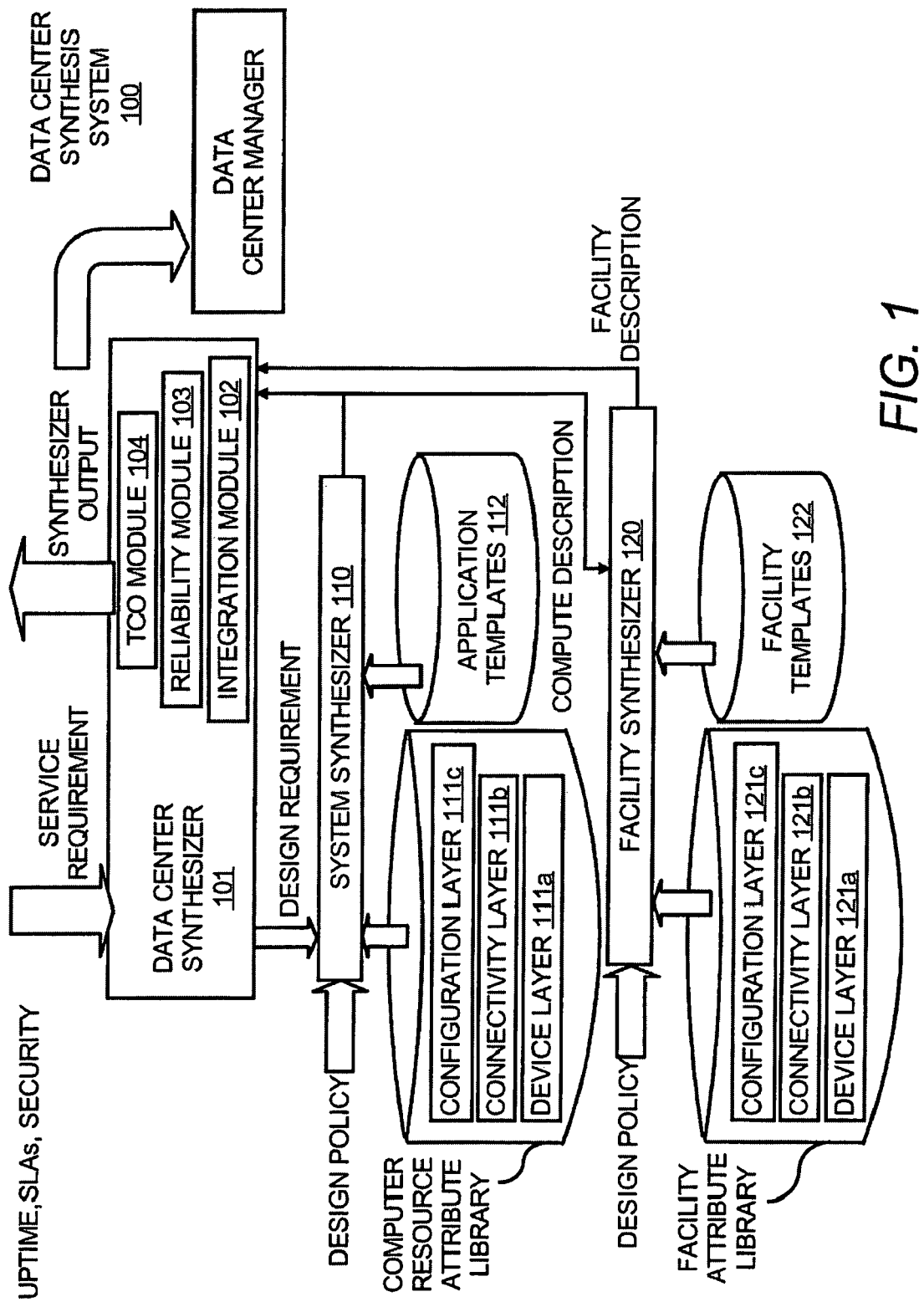
FIG. 1 illustrates a data center synthesis system, according to an embodiment.

FIG. 1 illustrates a data center synthesis system 100, according to an embodiment. The data center synthesis system 100 uses system and facility models to design a data center based on initial service requirements and design policies. The data center synthesis system 100 comprises a data center synthesizer 101, a system synthesizer 110 and a facility synthesizer 120.

The data center synthesizer translates service requirements to design requirements which lays the framework for the system synthesizer 110. Service requirements may include uptime, service level agreements (SLAs) and security. These service requirements are translated into design requirements. For example, a service level requirement from the customer may require that the customer's workload not be executed on a computer system that is running a workload of a competitor. This is translated into a design requirement that requires the customer's workload be run on its own virtual machine or server. Another example, may include an SLA requirement for a maximum response time for a web service. This is translated to required processing and memory to satisfy the SLA based on an estimated maximum number of users at any given epoch.

The system synthesizer 110 uses a computer resource attribute library 111 and application templates 112 to generate a compute description based on the design requirements and computer resource design policies. The computer resource attribute library 111 describes features of computer resources that can be used in the data center. For example, the library 111 includes server, storage, and network components including their raw capacity, performance capacity, availability characteristics, connectivity, configuration options, and model descriptions. In particular, the library 111 may include a device layer 111a, a connectivity layer 111b and a configuration layer 111c. The device layer 111a is comprised of device models including descriptions and attributes for hard drives, processors, memory, fans, heat sinks, PCI cards, etc. The connectivity layer 111b is comprised of topology models for deployment and connection of storage (including backup storage systems), network, compute (including processors, memory, etc.), thermo-mechanical (including cooling systems) and power delivery architectures. The configuration layer 111c includes components for configuring and managing the other components in the data center. For example, the configuration layer is comprised of local management processors (e.g., Hewlett-Packard's iLO/GSP management processor), data bus, firmware for low-level device monitoring and control. The configuration layer may also include operating system, virtual machines, and applications that can be deployed on a system. The components in each layer have their own attributes describing operational parameters and functional specifications. Attributes of each subcomponent of a component in a layer can be combined mathematically using network or other, non-classical analysis to create attributes which reflect the operational parameters and functional specifications of a composite component.

The application templates 112 include a library of templates providing accumulated knowledge regarding typical system designs for common service specifications. For example, if the service being designed is a web service, a web service application template may specify components from each layer based on the design requirements. For example, the design requirements may specify an estimated number of users or requests and a required maximum response time, and a template may be available in among the application templates 112 that specifies the components from each layer that satisfies the design requirements. Other examples of application templates include storage system architectures, network architectures, virtualized environment (e.g., virtual machines) architectures, rack or enclosure management systems, device level management systems, thermo-mechanical architectures and other applications. These templates may be used instead of building new architectures or systems from the library 111 if a template satisfies the design requirements and policies.

The system synthesizer 110 performs a series of design space walks and design evaluation resulting in a candidate compute design description. The compute description specifies the computer resources to be used in the data center, their required interconnections, and their operating loads. The computer resources include the hardware and software to be used for running workloads in the data center. For example, the system synthesizer 110 receives the design requirements, which may be low level metrics translated from SLAs, such as compute capacity, storage capacity, network capacity, etc. The system synthesizer 110 identifies components from the models in the library 111 and or the templates 112 that satisfy the design requirements. Also, design policies may be considered when selecting the components. For example, policies concerning efficiency may be used to determine the amount of over-provisioning that is acceptable. These selected computer resources, their required interconnections, and their operating loads are described in the compute description.

The compute description created by the system synthesizer 110 drives the generation of the facility description created by the facility synthesizer 120. The facility synthesizer 120 uses a facility attribute library 121 facility templates 122, design requirements and policies to generate the facility description describing the facilities to be used with the computer resources in the data center.

Facilities include multiple subsystems in a data center. Electricity is supplied either from the grid or an on-site generator; and then is conditioned on-site before delivery to the computer room. Central plant chillers provide continuous supply of cold water for use in the computer room air-conditioning (CRAC) units. Practically all the electrical energy supplied to the computing equipment is dissipated in the computer room as heat, which is then removed by a cooling medium (usually air circulated by air handlers or fans). Additionally, apart from the rack switches, network connectivity must be provided for enabling data transmission within and outside of the data center. Thus, facilities may include a power delivery system, which includes conditioning and backup equipment; the networking equipment, which includes all connectivity except the rack switches; and cooling systems, which includes both the central chillers and the CRAC units.

The facility attribute library 121 describes features of facilities that support the computer resources in the data center. The facility attribute library 121 includes a device layer 121a, a connectivity layer 121b and a configuration layer 121c. The device layer 121a is comprised of device models including descriptions and attributes for components of the facility subsystems, such as power distribution units (PDUs), uninterruptable power supplies (UPSs), transfer switches, heat exchangers, CRAC units, blowers, tiles, plenums, valves, hydronics elements, etc. The connectivity layer 111b is comprised of topology models for deployment and connection of the facility subsystems, including fluidic, power distribution, and communication network models. The configuration layer 121c includes components for configuring and managing the other components in the data center. For example, the configuration layer is comprised of local management processors (e.g., Hewlett-Packard's iLO/GSP management processor), data bus, firmware for low-level device monitoring and control for facilities. The configuration layer may also include local controllers for CRAC units or PDUs. Attributes of each subcomponent of a component in a layer can be combined mathematically using network or other, non-classical analysis to create attributes which reflect the operational parameters and functional specifications of the composite component.

Figure 2:
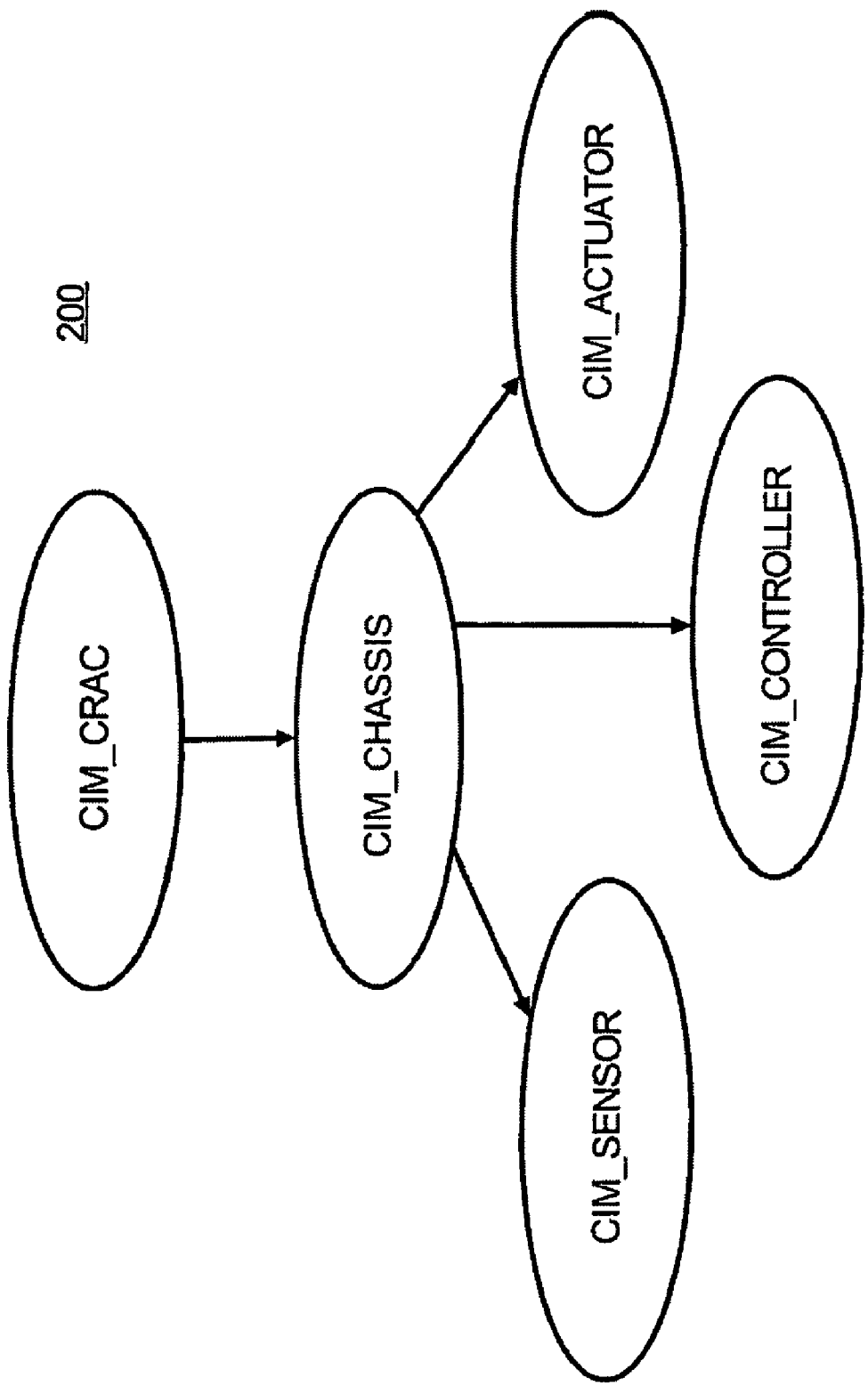
FIG. 2 illustrates an example of a high-level diagram of a Common Information Model (CIM) schema for a computer room air-conditioning unit, according to an embodiment.
Figure 3:
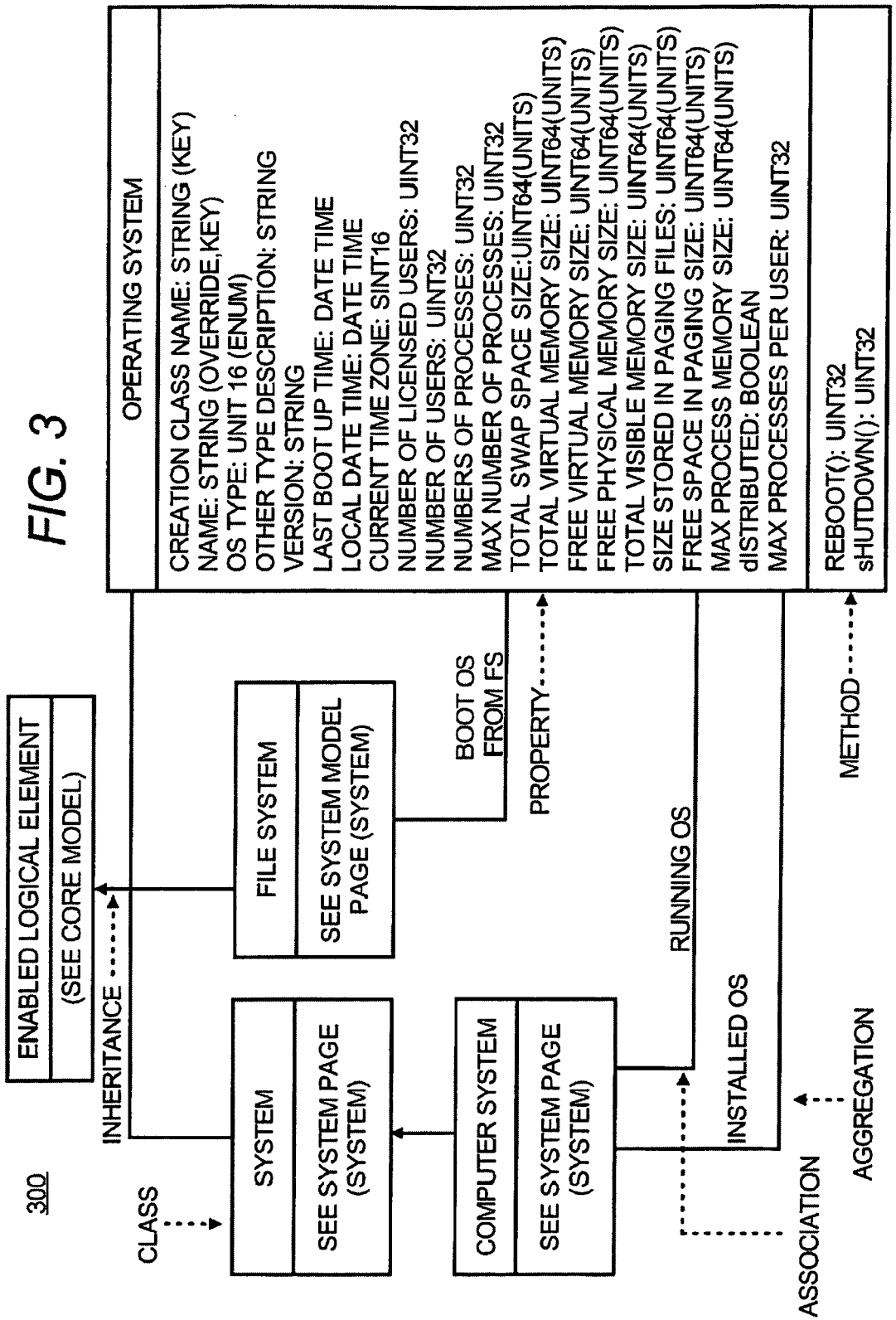
FIG. 3 illustrates an example of a CIM schema using a modeling language, according to an embodiment.

The models in the layers of the facilities attribute library 121 and the computer resources model 111 may be described using a modeling language, such as the Common Information Model (CIM). The CIM specification is the language and methodology for describing systems, applications and devices. FIG. 2 shows an example of a high-level diagram of a CIM schema 200 for a CRAC unit, which may be provided in the device layer 121a of the facility attribute library 121. FIG. 3 shows an example of a CIM schema 300 of a system.

The facility templates 122 include a library of templates providing system designs for common facilities. The facility templates may include physical layouts of the data center, power delivery architecture, hydronics systems, cooling delivery architecture, building management systems, etc.

The facility synthesizer 120 uses the facility attribute library 121 and the facility templates 122 to generate the facility description, similar to the system synthesizer 110 generating the compute description. However, the facility synthesizer 120 also uses the compute description generated by the system synthesizer 120 to select component for the facilities from the library 121 and/or the templates 122. The facilities may include subsystems that support the computer resources and other systems described in the compute description. Thus, the compute description is used to select components for the facilities. For example, the facility synthesizer 122 selects components for a power system from the library 121 and/or the templates 122 that can supply adequate power for the computer resources. Each of the facility description and the compute description captures the dependencies and functional relationships between the objects that belong to each layer (e.g., device, connection, and configuration layer).

The facility synthesizer 120 performs a series of design space walks and design evaluation resulting in a candidate facility description. The facility description specifies the facilities, their required interconnections, and their operating loads. Also, design policies may be considered when selecting the components. For example, policies concerning efficiency may be used to determine the amount of over-provisioning that is acceptable.

The data center synthesizer 101 includes an integration module 102, a reliability module 103 and a TCO module 104. The facility description and the compute description are sent to the data center synthesizer 101. The integration module 102 integrates the facility and system designs described by the facility description and the compute description. The integration module 102 makes decisions on how to integrate the systems. For example, fluid dynamic models and mappings of thermal and power zones may be used to determine how racks are placed in the data center to efficiently cool and power the racks. Estimated workload profiles are matched with cooling capacity. Also, network analysis may be performed for the integration decisions. Decisions are made regarding integrating the computer resource systems and facility systems fabrics. For example, decisions regarding cabling and connectors are made, and communication protocols are selected. The integrated facility and system designs captures the dependencies and functional relationships between the objects that belong to each layer (e.g., device, connection, and configuration layer) as well as between objects.

The facility and system designs integrated by the integration module 102 are evaluated for reliability by the reliability module 103. The integrated facility and system designs are referred to as an integrated view or an integrated system. The reliability module 103 performs an analysis of the integrated system. For example, information regarding lifetime, unreliability of devices over a period of time, and other stress factors is compiled from various sources, including manufacturers, internal testing and data mining, etc. This information is used to determine the availability in various zones of the data center. For example, the integrated system, as determined by integration module 102, may be viewed as zones or divided physical locations in the data center. The availability in various zones of the data center determined by the reliability module 103 identifies certain estimated metrics for the zone. For example, blades in a particular zone may have higher life times because they are estimated to receive the most cooling fluid due to their locations relative to CRAC units. These blades may have the best uptimes and are assigned a gold status. Higher criticality customer workloads are assigned to this zone. Lower criticality workloads are assigned to silver or bronze zones including systems that may be less reliable.

The availability information is combined with energy performance metrics and computer resource utilization estimations to determine the TCO for the given operational conditions. Based on the quality of the TCO and reliability result, the entire design process may be iterated again beginning with an adjusted design requirement. For example, in some instances, such as in emerging markets, the amounts that can be charged for running customer workloads may be less, but the customers may be less demanding with respect to certain SLAs, such as more tolerable response times or uptimes. If the analysis of the integrated system determines that the TCO is high and reliability of all the zones in the data center is high such that the projected gross revenue is negative, the entire design process is performed again with some changes in design requirements to create a more profitable design.

One example of calculating a TCO is shown in equation 400 in FIG. 4. It should be noted that other metrics may be considered when calculating a TCO. Some of the metrics considered in equation 400 include burdened power consumption, the cost of personnel (e.g., system administrators), hardware and software costs and depreciation per rack, and the cost of real estate (e.g., leasing or ownership) for the data center.

In equation 400, $J_1$ is a capacity utilization factor that is the ratio of maximum design (rated) power consumption to the actual data center power consumption. $K_1$ is a function of $J_1$ and is the burdened power delivery factor, i.e., the ratio of amortization and maintenance costs of the power delivery systems to the cost of grid power. Similarly, $K_2$ is a function of $J_1$ and is the burdened cooling cost factor, i.e., the ratio of amortization and maintenance costs of the cooling equipment to the cost of grid power. $L_1$ is the cooling load factor, which is the ratio of power consumed by cooling equipment to the power consumed by the computer resources, such as computer, storage and networking hardware.

$U_{\$,grid}$ is the cost of grid power in \$/KWh or \$/W per month. $P_{powerconsumed}$ is the power consumed by hardware, networking and cooling equipment (Watts). R is the number of racks utilized in a data center. $M_{total}$ is the ratio of the total number of all personnel servicing the data center to the number of racks in the data centers. $S_{avg}$ is the average salary of data center IT, facilities (not including preventive maintenance), and administrative person per rack. $IT_{dep}$ is the straight line monthly depreciation of IT equipment, typically over a 3-year period (per rack). $\sigma 1$ is the software and licensing costs per rack (per month). $A_{critical}$ is the net operating income (in \$) and is calculated as the difference between gross operating income and actual operating costs not including amortization and maintenance.

Upon achieving a design with the data center synthesizer 101 that meets the desired TCO, the data center is configured, which typically includes manual setup of the data center and its systems based on the description of the integrated system generated by the data center synthesizer 101. The data center may be configured in a statically well-provisioned state, for example by configuring the data center such that UPS's and CRAC units are loaded at the most efficient operational states, especially if design policies during the design phase required the efficient operation of these systems. Also, after the data center is up and running, a data center manager may be used to monitor the systems of the data center.

In addition to a determination of whether the integrated view satisfies a target TCO, the data center synthesizer outputs may include deployment views, a mapping of power and cooling zones and availability in the zones, and operational modes of components.

Figure 5:
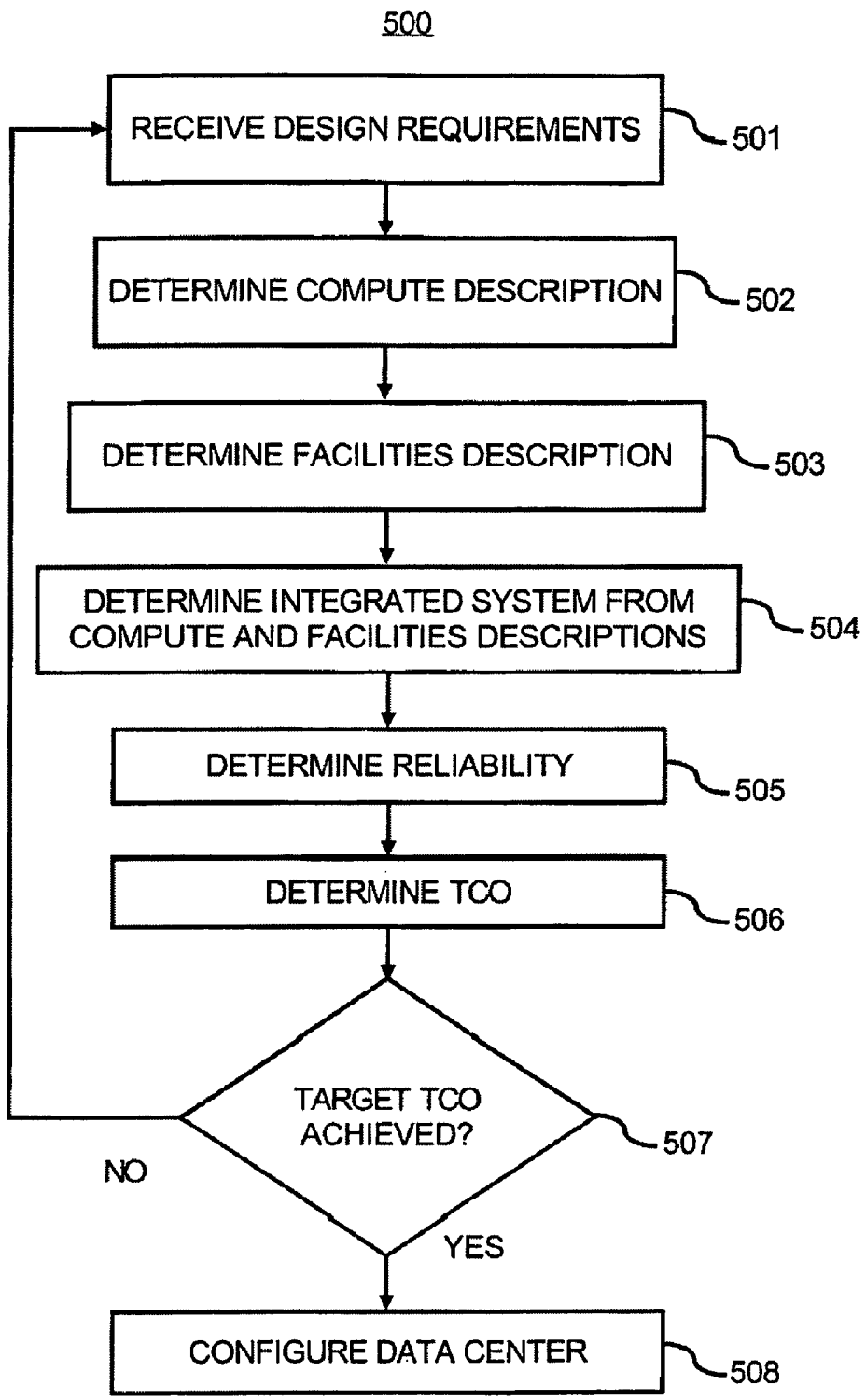
FIG. 5 illustrates a flow chart of a method for creating an integrated design for a data center, according to an embodiment.

FIG. 5 illustrates a method 500 for designing a data center, according to an embodiment. The method 500 may be described with respect to one or more of figures 104 by way of example and not limitation.

At step 501, design requirements for the data center are received. These may include design requirements translated from SLAs or other service-level metrics. The design requirements specify attributes of the systems and computer resources for the data center.

At step 502, a compute description is determined that describes the computer resources to be used in the data center. For example, the system synthesizer 110 shown in FIG. 1 generates a compute description from the design requirements and the compute attribute library 111 describing the computer resources that can be used in the data center. Templates and design polices may also be used to determine the compute description.

At step 503, a facility description is determined that describes the facilities to be used in the data center. For example, the facility synthesizer 120 uses the compute description and the facility attribute library 121 to generate the facility description. Templates and design polices may also be used to determine the facility description.

At step 504, an integrated system is determined from the compute description and the facility description. This includes an integrated description of the systems for the data center described in the compute description and the facility description. For example, the integration module 102 determines the integrated system from the compute description and the facilities description. The integrated system is a design of a system integrating the designs of the facilities and the computer resources.

At step 505, the reliability of the integrated system is determined. For example, the reliability module 103 determines stress factors for the components of the integrated system based on information compiled from one or more sources. Examples of stress factors include lifetime given a workload and environmental conditions, uptime and downtime for maintenance, efficiency for power and cooling, etc.

At step 506, the TCO is determined for the integrated system. For example, the TCO module 104 calculates a TCO for the integrated system.

At step 507, a determination is made as to whether a target TCO is achieved by comparing the TCO determined at step 506 with the target TCO. The target TCO may be determined, for example, to maximize profits given estimated workloads and revenue. If the target TCO is achieved, at step 508, the data center is configured based on the integrated view determined at step 504. For example, the data center is created based on the integrated system design generated by the integration module 102. If the target TCO is not achieved, some factors are varied at step 509, such as one or more of the design requirements. Then, the method 500 is repeated to determine a new integrated system.

Figure 6:
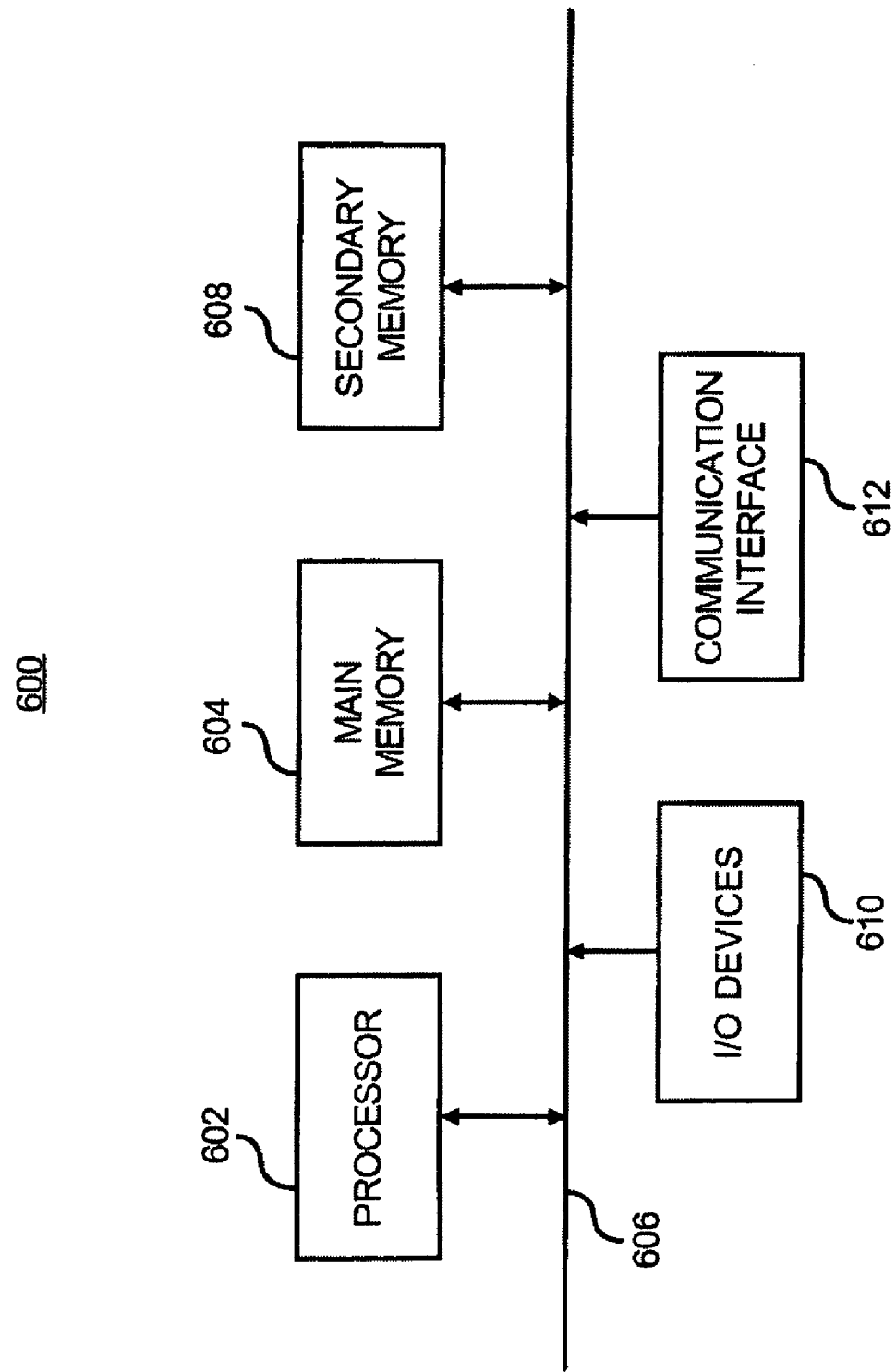
FIG. 6 illustrates a computer system, according to an embodiment.

FIG. 6 illustrates a block diagram of a general purpose computer system 600 that is operable to be used as a platform running the data center synthesis system 100 of FIG. 1. Components may be added or removed from the general purpose system 600 to provide the desired functionality.

The system 600 includes a processor 602, providing an execution platform for executing software. Commands and data from the processor 602 are communicated over a communication bus 606. The system 600 also includes a main memory 604, such as a Random Access Memory (RAM), where software may reside during runtime, and a secondary memory 608. The secondary memory 608 may include, for example, a nonvolatile memory where a copy of software is stored. In one example, the secondary memory 608 also includes ROM (read only memory), EPROM (erasable, programmable ROM), EEPROM (electrically erasable, programmable ROM).

The system 600 includes I/O devices 610. The I/O devices 610 may include a display and/or user interfaces, such as a keyboard, a mouse, a stylus, speaker, and the like. A communication interface 612 is provided for communicating with other components. The communication interface 612 may be a wired or a wireless interface. The communication interface 612 may be a network interface.

One or more of the steps in the method 500 and other steps and modules described herein are operable to be implemented as software stored on a computer readable medium, such as the memory 604 and/or 608, and executed on the system 600, for example, by the processor 602.

The steps are operable to be embodied by a computer program, which can exist in a variety of forms both active and inactive. For example, they exist as software program(s) comprised of program instructions in source code, object code, executable code or other formats for performing some of the steps. The codes described above may be embodied on a computer readable medium, which include storage devices and signals, in compressed or uncompressed form. Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

While the embodiments have been described with reference to examples, those skilled in the art will be able to make various modifications to the described embodiments without departing from the scope of the claimed embodiments.

What is claimed is:

1. A facility synthesizer system generating a description of facilities to be used in a data center, the facility synthesizer comprising:

a facility attributes library including a device layer, a connectivity layer and a configuration layer, wherein the device layer includes descriptions for components of facilities that are operable to be used in the data center, the connectivity layer includes description for connecting the facilities, and the configuration layer includes description of components for configuring and managing other components to be used in the data center;

facility templates describing commonly-used facilities; and a facility synthesizer, executed by a processor, to receive a compute description of computer resources to be used in the data center, and to use the compute description and at least one of the facility attributes library and one or more of the facility templates to determine facilities to be used in the data center to support the computer resources in the data center, wherein the facility synthesizer outputs a facility description including a description of the facilities to be used in the data center, and wherein the facilities to be used in the data center comprise at least one of power systems and cooling systems.

2. The facility synthesizer of claim 1, wherein the description of the facilities comprises configurations and connections for the power systems and the cooling systems.

3. The facility synthesizer of claim 1, wherein the description of the facilities includes intended operating parameters for the power systems and cooling systems to maximize predetermined objectives.

4. The facility synthesizer of claim 1, wherein the facility synthesizer uses a design policy to determine the facilities to be used in the data center.

5. The facility synthesizer of claim 4, wherein the design policy specifies the required efficiency for at least one of the power system and the cooling system.

6. A data center synthesis system configured to generate an integrated data center design including designs for computer resources and data center facilities, the data center synthesis system comprising:

a system synthesizer receiving user design requirements for computer resources to be used in the data center and generating a compute description of the computer resources to be used in the data center based on the design requirements and models of computer resources operable to be used in the data center;

a facility synthesizer receiving the compute description and generating a facility description of the facilities to be used in the data center to support the computer resources based on the compute description and models of facilities operable to be used in the data center, wherein the facilities to be used in the data center comprise at least one of power systems and cooling systems; and a data center synthesizer, executed by a processor, to generate a description of a design of a data center including the facilities and computer resources described in the facility description and the compute description.

7. The data center synthesis system of claim 6, wherein the system synthesizer uses a design policy to generate the compute description, the design policy specifying constraints on the computer resources to be used in the data center.

8. The data center synthesis system of claim 6, wherein the models for generating the compute description are stored in a computer resource attribute library and application templates describing commonly-used systems, and the models comprise a device layer, a connectivity layer and a configuration layer, wherein the device layer includes descriptions for computer resources operable to be used in the data center, the connectivity layer includes descriptions for connecting the computer resources, and the configuration layer includes descriptions of components for configuring and managing the computer resources to be used in the data center.

9. The data center synthesis system of claim 6, wherein the compute description specifies the computer resources to be used in the data center, their required interconnections, and their operating loads.

10. The data center synthesis system of claim 6, wherein the facility synthesizer uses a design policy to generate the facility description, the design policy specifying constraints on the facilities to be used in the data center.

11. The data center synthesis system of claim 6, wherein the models for generating the facility description are stored in a facility library and facility templates describing commonly-used facilities, and the models include a device layer, a connectivity layer and a configuration layer, wherein the device layer includes descriptions for components of facilities that are operable to be used in the data center, the connectivity layer includes descriptions for connecting the facilities, and the configuration layer includes descriptions of components for configuring and managing other components to be used in the data center.

12. The data center synthesis system of claim 6, wherein the facility description specifies the facilities to be used in the data center, their required interconnections, and their operating loads.

13. The data center synthesis system of claim 6, wherein the facility description comprises configurations and connections for the power systems and the cooling systems.

14. The data center synthesis system of claim 6, wherein the data center synthesizer comprises an integration module determining an integrated system including the computer resources and facilities described in the compute description and the facility description.

15. The data center synthesis system of claim 14, wherein the data center synthesizer comprises a reliability module determining stress factors for the components of the integrated system based on information compiled from one or more sources.

16. The data center synthesis system of claim 15, wherein the data center synthesizer comprises a total cost of ownership (TCO) module calculating a TCO of ownership for the data center described in the integrated system, and determining whether a target TCO is achieved.

17. A method of determining a design of a data center comprising:

receiving design requirements;

determining a compute description that describes computer resources to be used in the system from the design requirements and models of the computer resources, wherein the models include a device layer, a connectivity layer and a configuration layer and the device layer includes descriptions for computer resources operable to be used in the data center, the connectivity layer includes descriptions for connecting the computer resources, and the configuration layer includes descriptions of components for configuring and managing the computer resources to be used in the data center;

determining a facility description that describes facilities to be used in the data center from the compute description and models of the facilities, wherein the models of the facilities include a device layer, a connectivity layer and a configuration layer and the device layer includes descriptions for components of facilities that are operable to be used in the data center, the connectivity layer includes descriptions for connecting the facilities, and the configuration layer includes descriptions of components for configuring and managing other components to be used in facilities in the data center; and determining, by a processor, an integrated system from the compute description and the facility description, the integrated system including a description of the systems for the data center described in the compute description and the facility description and their interconnections.

18. The method of claim 17, further comprising:

calculating a TCO for the integrated system;

determining whether a target TCO is achieved by comparing the calculated TCO to the target TCO; and if the target TCO is not achieved, then repeating the steps of determining a compute description, determining a facility description, and determining an integrated system using new design requirements.

19. The method of claim 18, further comprising:

configuring the data center.

* * * * *

UNITED STATES PATENT AND TRADEMARK OFFICE
CERTIFICATE OF CORRECTION

PATENT NO. : 8,131,515 B2  
APPLICATION NO. : 12/254664  
DATED : March 6, 2012  
INVENTOR(S) : Ratnesh Sharma et al.

Page 1 of 1

It is certified that error appears in the above-identified patent and that said Letters Patent is hereby corrected as shown below:

On the Title page, in item (75), Inventors, in column 1, line 2, delete "Chandrakani" and insert -- Chandrakant --, therefor.

Signed and Sealed this  
Thirtieth Day of April, 2013

Teresa Stanek Rea  
*Acting Director of the United States Patent and Trademark Office*